United States Patent
Biber et al.

(10) Patent No.: US 11,940,513 B2
(45) Date of Patent: Mar. 26, 2024

(54) METHOD AND APPARATUS FOR SUPPRESSING INTERFERENCE EMISSIONS IN MAGNETIC RESONANCE SYSTEMS

(71) Applicant: Siemens Healthcare GmbH, Erlangen (DE)

(72) Inventors: Stephan Biber, Erlangen (DE); Jürgen Nistler, Erlangen (DE); Markus Vester, Nuremberg (DE)

(73) Assignee: Siemens Healthineers AG, Forchheim (DE)

( * ) Notice: Subject to any disclaimer, the term of this patent is extended or adjusted under 35 U.S.C. 154(b) by 275 days.

(21) Appl. No.: 17/476,459

(22) Filed: Sep. 15, 2021

(65) Prior Publication Data

US 2022/0082642 A1 Mar. 17, 2022

(30) Foreign Application Priority Data

Sep. 16, 2020 (DE) .................... 10 2020 211 602.4
Sep. 16, 2020 (DE) .................... 10 2020 211 606.7
Sep. 16, 2020 (DE) .................... 10 2020 211 608.3

(51) Int. Cl.
*G01R 33/36* (2006.01)
*G01R 33/34* (2006.01)

(52) U.S. Cl.
CPC ... *G01R 33/3692* (2013.01); *G01R 33/34038* (2013.01); *G01R 33/3614* (2013.01)

(58) Field of Classification Search
CPC .......... G01R 33/3692; G01R 33/34038; G01R 33/3614
See application file for complete search history.

(56) References Cited

U.S. PATENT DOCUMENTS 6,954,068 B1 * 10/2005 Takamori ........... G01R 33/3854
324/318
2008/0132909 A1 * 6/2008 Jascob .................. A61B 34/20
600/407

(Continued)

FOREIGN PATENT DOCUMENTS

EP    3467531 A1   4/2019
WO   2019068687 A2  4/2019

OTHER PUBLICATIONS

Gao, Xu, et al. "Far-field prediction using only magnetic near-field scanning for EMI test." IEEE transactions on electromagnetic compatibility 56.6 (2014): 1335-1343.

(Continued)

*Primary Examiner* — Dixomara Vargas
(74) *Attorney, Agent, or Firm* — Lempia Summerfield Katz LLC

(57) ABSTRACT

A magnetic resonance tomography unit and a method for operating the magnetic resonance tomography unit are provided. The magnetic resonance tomography unit has a transmission interference suppression device with a transmission interference suppression control system, a sensor, and a transmission interference suppression antenna. The transmission interference suppression device is configured to acquire, with the sensor, an excitation signal of the transmitter, and determine, with the transmission interference suppression control system, a transmission interference suppression signal dependent upon the acquired excitation signal of the transmitter. The transmission interference suppression device is configured to transmit, via the transmission interference suppression antenna, the transmission interference suppression signal, so that at a predetermined location outside the magnetic resonance tomography unit, (Continued)

the excitation signal emitted by the transmitter via the transmitter antenna is attenuated.

16 Claims, 5 Drawing Sheets

(56) References Cited

U.S. PATENT DOCUMENTS

| | | | | |
|---|---|---|---|---|
| 2010/0060282 | A1* | 3/2010 | Shvartsman | G01R 33/421 |
| | | | | 324/318 |
| 2013/0197349 | A1* | 8/2013 | Blumhagen | G01R 33/481 |
| | | | | 600/411 |
| 2020/0132792 | A1* | 4/2020 | Vermilyea | G01R 33/3403 |
| 2020/0237320 | A1* | 7/2020 | Fang | A61B 6/4417 |
| 2020/0249292 | A1* | 8/2020 | Biber | G01R 33/3614 |
| 2021/0025954 | A1* | 1/2021 | Biber | G01R 33/385 |
| 2021/0208294 | A1* | 7/2021 | Wu | G01T 1/202 |
| 2021/0325494 | A1* | 10/2021 | Biber | G01R 33/546 |
| 2022/0018919 | A1* | 1/2022 | Grodzki | G01R 33/36 |
| 2022/0082642 | A1* | 3/2022 | Biber | G01R 33/34038 |
| 2022/0137168 | A1* | 5/2022 | Nistler | G01R 33/422 |
| | | | | 324/309 |
| 2022/0187394 | A1* | 6/2022 | Biber | G01R 33/3621 |
| 2022/0291310 | A1* | 9/2022 | Nistler | G01R 33/36 |
| 2023/0087433 | A1* | 3/2023 | Schneider | G01R 33/422 |
| | | | | 324/309 |

OTHER PUBLICATIONS

German Office Action for German Application No. 10 2020 211 606.7 dated Jul. 6, 2021.

Kurpad, Krishna N., Steven M. Wright, and Eddy B. Boskamp. "RF current element design for independent control of current amplitude and phase in transmit phased arrays." Concepts in Magnetic Resonance Part B: Magnetic Resonance Engineering: An Educational Journal 29.2 (2006): 75-83.

Twieg, Michael, and Mark A. Griswold. "High Efficiency RFPA Module for pTX at 3 T." Magnetic resonance in medicine 78.4 (2017): 1-18.

* cited by examiner

METHOD AND APPARATUS FOR SUPPRESSING INTERFERENCE EMISSIONS IN MAGNETIC RESONANCE SYSTEMS This application claims the benefit of German Patent Application Number DE 10 2020 211 602.4, filed on Sep. 16, 2020, German Patent Application Number DE 10 2020 211 608.3, filed on Sep. 16, 2020, and German Patent Application Number DE 10 2020 211 606.7, filed on Sep. 16, 2020, which are hereby incorporated by reference in its entirety.

BACKGROUND

The present embodiments relate to a magnetic resonance tomography unit with a transmission interference suppression device having an interference suppression control system, a sensor and a transmission interference suppression antenna.

Magnetic resonance tomography units are imaging apparatuses that, for imaging an examination object, align nuclear spins of the examination object with a strong external magnetic field and, using an alternating magnetic field, excite the nuclear spins to precession about this alignment. The precession and/or the return of the spin from this excited state into a state with lower energy itself generates an alternating magnetic field as the response, which is received via antennae.

With the aid of magnetic gradient fields, a position encoding is impressed upon the signals, which subsequently enables an allocation of the received signal to a volume element. The received signal is then evaluated, and a three-dimensional imaging representation of the examination object is provided. For receiving the signal (e.g., local receiving antennae), local coils are used that, in order to achieve a better signal-to-noise ratio, are arranged directly on the examination object. The receiving antennae may also be installed in a patient support.

Magnetic resonance tomography units use radio frequency screening in two regards. First, in order to excite the nuclear spins, radio frequency pulses with power levels in the kilowatt range are generated, and these are only partially absorbed in the patient. Radio waves that emerge from the patient tunnel are radiated into the space and are therefore to be screened out to maintain emission limit values.

Conversely, the magnetic resonance signals to be received for the imaging are extremely weak. In order to achieve a sufficient signal-to-noise ratio (SNR), a screening of external interference signals is to be provided.

Therefore, in the prior art, complex screening cabins are installed around a magnetic resonance tomography unit in order to reduce both emissions and also immissions.

From the published document WO 2019/06867 A2, a magnetic resonance tomography unit with active interference suppression and a method for the operation thereof is known.

In apparatuses of this type, achieving a stable interference suppression with different interfering influences is problematic.

SUMMARY AND DESCRIPTION

The scope of the present invention is defined solely by the appended claims and is not affected to any degree by the statements within this summary.

The present embodiments may obviate one or more of the drawbacks or limitations in the related art. For example, interference suppression may be improved.

The magnetic resonance tomography unit according to the present embodiments has a magnet unit, a transmitter, and a transmitter antenna for exciting nuclear spins. Typically, a field magnet of the magnet unit is configured as a superconducting magnet due to the field strengths achievable in the static magnetic field B0, which determines the resonance frequency and/or the Larmor frequency of the nuclear spins.

The magnetic resonance tomography unit according to the present embodiments further has an interference suppression device with an interference suppression control system, a sensor, and a transmission interference suppression antenna. The interference suppression device is therein configured to acquire excitation signal of the transmitter with the sensor.

The sensor may be, for example, an antenna (e.g., a conductor loop) in which a voltage is induced by a magnetic component of an excitation signal. Any radio frequency alternating magnetic field that the magnetic resonance tomography unit emits is regarded as an excitation signal.

Typically, the excitation signal is emitted in the form of time-limited (e.g., short) excitation pulses. This may be a test pulse for calibrating the interference suppression device, but also an excitation pulse to influence the orientation of nuclear spins in the patient in the magnetic field B0. The sensor passes on a signal regarding the excitation signal and/or the pulse to the transmission suppression control system. The signal may be, for example, a voltage or a current that is proportional to the induced current or, in the case of an electrical antenna, by the voltage induced by the electric field. The signal may, however, also already be digitized by an analog-digital-converter. A sensor may also be configured for this purpose to ascertain a polarization of the field (e.g., for the H-field) using two orthogonal antenna loops, or for the E-field using two dipoles oriented perpendicularly to one another.

The transmission interference suppression control system is configured to determine a transmission interference suppression signal dependent upon the acquired pulse from the transmitter and to emit the transmission interference suppression signal via the transmission interference suppression antenna, so that at a predetermined location in the far field of the transmitter antenna outside the magnetic resonance tomography unit, the excitation signal emitted by the transmitter via the transmitter antenna is attenuated. An alternating electromagnetic field generated by the transmitter antenna in which the H-field and the E-field are in phase and which exists typically at a distance greater than once, twice, or multiple times, the wavelength is regarded as the far field. The attenuation may be achieved in that, for example, a signal is provided via the transmission interference suppression antennae through phase shift and amplification/damping that weakens or cancels out the excitation signal in the far field by destructive interference. In one embodiment, in an optimization procedure, the parameters of phase shift and damping may be varied, so that the field strength in the far field becomes minimal.

In one embodiment, the interference suppression device leads thereto that the interference field is reduced and/or minimized not only at the location of the sensor, but also in the far field in the surroundings of the magnetic resonance tomography unit.

The method according to the present embodiments may also include the act of receiving an information item regarding the excitation signal. In one embodiment, the information item relates to an amplitude or phase of the excitation signal. The information may be, for example, the signal of an antenna loop as the sensor. The information may be, for example, the signal of an antenna loop, a directional coupler, or a current sensor in a signal connection between the transmitter and the transmitter antenna. In one embodiment, however, the information item is through the control system of the magnetic resonance tomography unit regarding frequency, amplitude, or the frequency of the excitation signal.

In a further act of the method according to the present embodiments, the transmission interference suppression control system determines a transmission interference suppression signal dependent upon the information such that when the transmission interference suppression signal is emitted via the transmission interference suppression antenna, a field strength of the excitation signal at a predetermined location in the far field is reduced. An exemplary method for the determination has already been set out in relation to the apparatus claim and is described below.

In a further act of the method, the transmission interference suppression device transmits the transmission interference suppression signal via the transmission interference suppression antenna.

The method according to the present embodiments shares the advantages of the magnetic resonance tomography unit according to the present embodiments.

In one embodiment of the magnetic resonance tomography unit, the plurality of the sensors densely surrounds the transmitter antenna at least in an interference suppression direction.

To maintain the limit values in the entire three-dimensional surrounding space, accordingly, an arrangement on a surface of a three-dimensional body completely enclosing the transmitter antenna (e.g., a sphere, a cube, a tetrahedron, in general a polyhedron, or also an irregular body) is to be provided. The interference suppression direction then includes all spatial directions.

Described as dense is a spacing of the sensors from one another in the interference suppression direction, which permits the field to be determined at a location in the interference suppression direction at a greater distance than that of the sensors from the magnetic resonance tomography unit, using the electromagnetic field equations. A complete knowledge of the electromagnetic fields in this context for the interference suppression direction permits, in an analogy with a Huygens box, a virtual source to be determined from the fields on the surface of the Huygens box and with these to determine the fields in the far field outside the Huygens box. For this purpose, the spacing of the sensors on the surface does not exceed a particular maximum spacing (e.g., not greater than a tenth, an eighth, or a quarter of a wavelength of the excitation signal emitted by the transmitter antenna in free space).

In one embodiment, the sensors are configured to detect quantitatively components of the H-field and/or the E-field tangential to the surface of the body.

This interference suppression direction may, however, also be, for example, a plane or a solid angle in which limit values for electromagnetic radiation are to be complied with. Typically, this involves a horizontal plane or sectors in this plane in which persons move around and may approach the magnetic resonance tomography unit. In one embodiment, this involves a vertical plane if, for example, persons may be present above the magnetic resonance tomography unit in a multistory building. The constancy of the electromagnetic fields and straight-line propagation of the waves permits conclusions to be drawn, even with an incomplete coverage of a shell and/or surface around the transmitter antenna and/or Huygens box by sensors in analogy to the Huygens box, regarding the propagation in the interference suppression direction. This applies, for example, for a transmitter antenna in the patient tunnel if the tunnel is delimited by metallic walls since a correspondingly dense coverage of the opening by, for example, a network of sensors is sufficient since it is also only here that alternating electromagnetic fields may emerge to an appreciable extent.

The spacing of the sensors from one another may be smaller than a quarter of the wavelength in free space of a radio frequency signal at the Larmor frequency of the magnetic resonance tomography unit.

In one embodiment, the spacing permits sensors that, completely or at least partially, densely surround the transmitter antenna to determine and monitor, with the sensors in the near field, the far field emission, so that an installation in the space removed from the magnetic resonance tomography unit may be avoided.

In one embodiment of the magnetic resonance tomography unit, the plurality of the sensors densely surrounds the transmission interference suppression antenna entirely at least in an interference suppression plane. The statements above regarding the arrangement of the sensors in relation to the transmitter antenna applies similarly for a transmission interference suppression antenna or transmission interference suppression antennae with regard to the sensors arranged around these (e.g., regarding the spatial arrangement and spacing).

In one embodiment, the sensors arranged around the transmission interference suppression antennae permit, from field information obtained in the near field, conclusions to be drawn regarding the far field of the transmission interference suppression antennae.

For example, if the sensors surround both the transmitter antenna and also the transmission interference suppression antenna, a maintenance of emission limit values may be achieved even without a sensor in the far field.

In one embodiment of the magnetic resonance tomography unit, the predetermined location is given by a distance defined by regulation for an EMC limit value. For this location, a limit value for the E-field quantity and/or the H-field quantity is predetermined by regulatory values that are not to be exceeded. For example, this may be a spacing of more than 5 m or more than 10 m from the transmitter antenna. In one embodiment, this is the limit of an access restriction to the magnetic resonance tomography unit such as a separating wall, a wall, a door, or suchlike.

In one embodiment, with the sensor at the limit of the restriction, it is provided that outside the limit, the limit values are reliably maintained.

In a possible embodiment of the magnetic resonance tomography unit, the transmission interference suppression control system has a signal connection to the transmitter. The signal connection is configured to receive an information item regarding the excitation signal. This connection may be, for example, a radio frequency line which conducts a signal of the excitation signal dampened by a predetermined factor (e.g., the factor 40 dB, 60 dB or more) from the final stage of the transmitter to the transmission interference suppression control system. In one embodiment, the unamplified signal may be conducted before the final stage with the radio frequency line to the transmission interference suppression control system. A digital or wireless transfer may also be provided. During the transfer to the transmission interference suppression control system, the information is not to be altered directly by external circumstances (e.g., the patient) during the transmission. The transmission interference suppression control system is configured to determine the transmission interference suppression signal dependent upon the received information. For example, the transmission interference suppression signal may be obtained by damping/amplification and/or phase shifting.

In one embodiment of the magnetic resonance tomography unit, the information item regarding the excitation signal represents an amplitude and/or a phase of the excitation signal. For example, the information item may be the signal proportional to the excitation signal or a digitally sampled signal with a sampling frequency above the minimum sampling rate defined by Nyquist. In one embodiment, however, a time-constant signal may be a representation of the maximum amplitude and frequency and also of a phase. Mixed forms may also be provided, such as amplitude, frequency, and phase of a carrier wave and a baseband signal that is to be modulated.

In one embodiment, by transferring the information to the transmission interference suppression control system, the system may adapt the interference suppression signal to the current excitation signal in each case.

In a possible embodiment of the magnetic resonance tomography unit, the information item regarding the excitation signal is proportional to a magnetic field generated by the transmitter antenna. In other words, the transmission interference suppression device receives an information item regarding the excitation signal that indicates a magnetic field strength of the excitation signal emitted by the transmitter antenna or is proportional thereto.

Between an output signal generated by the transmitter and a magnetic field strength generated therefrom by the transmitter antenna at, for example, different frequencies or different loads from a patient, significant differences in the magnetic field strength that, in turn, directly influence the field strength of the wave propagating in the space may occur. An active interference suppression may therefore be better set given a relatively exact knowledge of the magnetic fields.

In one embodiment of the magnetic resonance tomography unit, the transmission interference suppression device has a directional coupler. The directional coupler is arranged on a signal connection between the transmitter and the transmitter antenna, so that a strength of a current flowing in the direction of the transmitter antenna is detected as a signal by the directional coupler. In one embodiment, the directional coupler is close (e.g., less than 10% of a wavelength of the center frequency of the excitation signal on the signal connection arranged at a root and/or feed point of the transmitter antenna). In one embodiment, two directional couplers are arranged on the signal connection. The two directional couplers absorb the current flow of the excitation signal passing to the antenna and of the reflected excitation signal, so that a difference may be formed therefrom.

Using the directional coupler, the current flow that directly influences the fields may be acquired. Through the arrangement close to the root, phase shifts between current and voltage may be minimized; two opposingly directed directional couplers permit the reflected current to be detected directly and taken into account.

In a possible embodiment of the magnetic resonance tomography unit, the transmission interference suppression device has a radio frequency amplifier that is arranged in direct proximity to the transmission interference suppression antenna. Direct proximity is regarded as existing if the spacing of the feed point or root point of the transmission interference suppression antenna is less than a tenth of the wavelength of the center frequency of the excitation signal on the signal line. In one embodiment, the radio frequency amplifier is therein a current source amplifier (e.g., the amplifier applies a voltage to the transmitter antenna such that the amplifier forces a predetermined current, such as independently of a load or impedance variation).

By the proximity (e.g., in the case of a current source amplifier), it is provided that the transmission interference suppression signal emitted by the forced current in the antenna also substantially corresponds to the signal that is fed to the radio frequency amplifier by the transmission interference suppression control system. For example, frequency dependencies are thereby minimized.

In a possible embodiment of the magnetic resonance tomography unit, the transmission interference suppression device has a plurality of sensors and/or transmission interference suppression antennae, each at different locations. For example, the sensors and/or the transmission interference suppression antennae may surround the transmitter antenna and/or the magnetic resonance tomography unit in a plane (e.g., horizontally), in which persons or other possibly interference-susceptible apparatuses are situated. In one embodiment, the arrangement completely surrounds the transmitter antenna in all spatial directions in order to prevent disturbances. Therein, the sensors have a spacing from the respectively adjacent sensor that is smaller than a quarter or a tenth of a wavelength of the excitation signal.

In one embodiment the arrangement completely surrounds the transmitter antenna in all spatial directions in order to prevent any disturbances in all spatial directions. Therein, the sensors have a spacing from the respectively adjacent sensor that is smaller than a quarter or a tenth of a wavelength of the excitation signal.

The transmission interference suppression device is further configured to determine a transmission interference suppression signal dependent upon the excitation signals of the transmitter acquired via the plurality of sensors and to emit the transmission interference suppression signal via the transmission interference suppression antennae, so that at the predetermined locations in the far field, the excitation signal emitted by the transmitter via the transmitter antenna is attenuated. For example, in one embodiment, the transmission interference suppression control system determines the phase shifts and damping of the individual transmission interference suppression signals through an optimization method such that through interference, the total of the energies at predetermined locations in the far field is minimized.

In one embodiment of the magnetic resonance tomography unit, the transmission interference suppression signal has a plurality of components. For example, the transmission interference suppression signal may involve signals each of which differs in phase and amplitude. The transmission interference suppression device is configured to in each case transmit a component via a respective one transmission interference suppression antenna of the plurality of transmission interference suppression antennae. For example, the transmission interference suppression device may have a plurality of radio frequency amplifiers that amplify the components and conduct the components via signal lines to a plurality of transmitter antennae via which the transmission interference suppression signal and/or components of the transmission interference suppression signal are emitted.

In one embodiment, the transmission interference suppression device may thus achieve a reduction of the radiation in many predetermined directions.

In a possible embodiment of the method, the method further has the act of emitting a test pulse with the transmitter via the transmitter antenna. A temporally limited predetermined radio frequency wave train with a known amplitude, frequency, and phase is regarded as the test pulse. In one embodiment, the amplitude is significantly smaller than in an excitation signal (e.g., by more than 20 dB, 40 dB or 60 dB).

In a further act, the sensor detects and/or the sensors detect a field strength of the radio frequency electromagnetic field evoked by the test pulse (e.g., according to the sensor, the E-field and/or the H-field). In one embodiment, at least the components of the field that are arranged tangentially to a surface of a shell and/or a curve on which the sensors are arranged around the transmitter antenna are detected.

In a further act, the transmission interference suppression control system may determine a far field transfer function of the transmitter antenna. At least a damping of the amplitude and/or a proportionality factor between the amplitude of the test pulse and the field strength evoked prior thereto at a predetermined location in the far field and a delay and/or phase shift from the test pulse at the predetermined site is regarded as the transfer function. For example, the transmission interference suppression signal may be determined by an application of the inverse of the determined transfer function and an inverse of a transfer function between the sensor and the transmission interference suppression antenna to an excitation signal.

In one embodiment, in accordance with a so-called Huygens box, from the signals of the sensors on the surface of the Huygens box, a source in the form of the transmitter antenna situated therein and a wave propagating in the far field from the transmitter antenna may be inferred. For this purpose, from the E and H-fields tangential to the surface, a virtual signal source may be determined with the field equations, and for this signal source, the transfer function may then be determined for a predetermined location in the far field. For this purpose, the sensors enclose the transmitter antenna at a small spacing at least in one plane on a curve or also in all spatial directions on a shell.

In an embodiment of the method, the transmission interference suppression device has a plurality of sensors and transmission interference suppression antennae. The sensors and transmission interference suppression antennae surround the transmitter antenna in a plurality of directions or all around at least in one plane or in each spatial direction in order to be able to reduce the propagation of the interference in a plurality of directions. In the act of detecting, the plurality of sensors detect a field strength of the test pulse, and in the act of determining, the transmission interference suppression control system determines a plurality of transfer functions for the plurality of sensors. As previously stated regarding an individual sensor, the act of determining the transmission interference suppression signal takes place dependent upon the plurality of transfer functions.

The transfer function that is determined simplifies and accelerates the determination of the transmission interference suppression signals.

In a possible embodiment of the method according to the present embodiments, the method includes the act of detecting a field strength of the excitation signal with the sensor. In the act of determining the transmission interference suppression signal, an optimization algorithm minimizes the energy of the excitation signal received with the sensor, dependent upon the field strength detected.

In the same way, it is also conceivable, using the sensors, to determine one or more transfer functions of the transmission interference suppression antenna or antennae if the sensors also surround the transmission interference suppression antenna or antennae.

Herein, the act of determining the transmission interference suppression signal takes place dependent upon the transfer function or functions thus determined. For example, the interference signal may be determined at the predetermined location in the far field by use of the determined transfer function between the transmitter antenna and the location in the far field at which the excitation signal emitted by the transmitter antenna is determined. By inverting the sign and using an inverse of a transfer function between the transmission interference suppression antenna and the sensor, the transmission interference suppression signal that is to be emitted via the transmission interference suppression antennae for reducing the field strength of the excitation signal at the predetermined location in the far field may be determined. For a plurality of sensors, transmission interference suppression antennae and predetermined locations with a reduced field strength of the excitation signal, in a linear optimization, the amplification and phase shift for each transmission interference suppression antenna and/or the supplying radio frequency amplifier may be set.

The transfer function or transfer functions that are determined simplify and accelerate the determination of the transmission interference suppression signals.

In one embodiment, using an optimization method, the entire interference emission may be reduced by the excitation signal.

DETAILED DESCRIPTION

Figure 1:
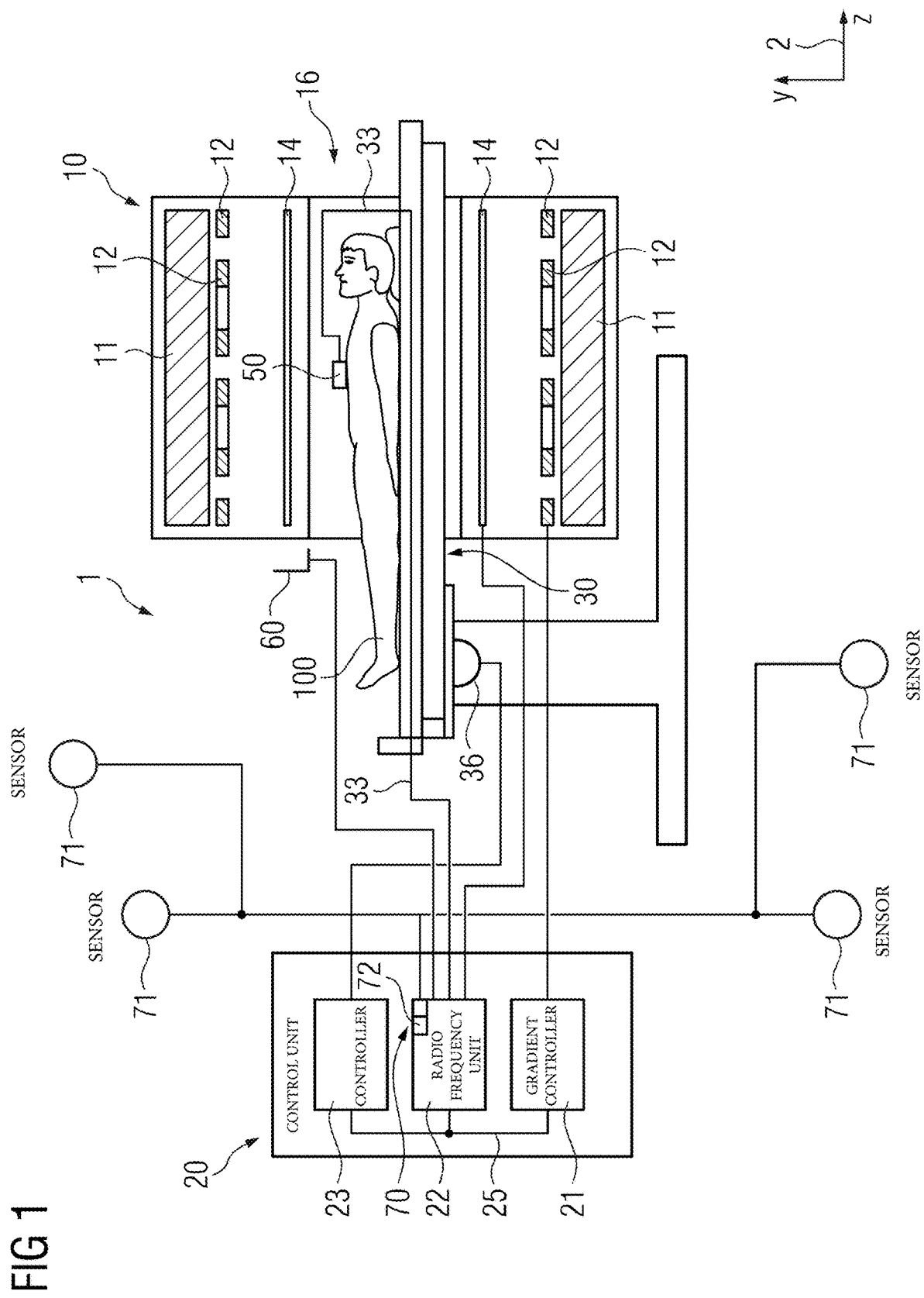
FIG. 1 shows a schematic representation of one embodiment of a magnetic resonance tomography unit with a transmission interference suppression device.

FIG. 1 shows a schematic representation of an embodiment of a magnetic resonance tomography unit 1 with a transmission interference suppression device 70.

The magnet unit 10 has a field magnet 11 that generates a static magnetic field B0 for aligning nuclear spins of samples and/or of the patient 100 in a scanning region. The scanning region is characterized by an extremely homogenous static magnetic field B0, where the homogeneity relates, for example, to the magnetic field strength and/or the magnitude. The scanning region is almost spherical and is arranged in a patient tunnel 16 that extends in a longitudinal direction 2 through the magnet unit 10. A patient support 30 is movable in the patient tunnel 16 by the displacement unit 36. Typically, the field magnet 11 is a superconducting magnet that may provide magnetic fields with a magnetic flux density of up to 3 T and, in newest devices, even higher.

For lower field strengths, however, permanent magnets or electromagnets with normally conducting coils may also be used.

The magnet unit 10 further includes gradient coils 12 that are configured, for spatial differentiation of the acquired imaging regions in the examination volume, to overlay variable magnetic fields onto the magnetic field B0 in three spatial directions. The gradient coils 12 are typically coils made of normally conducting wires that may generate mutually orthogonal fields in the examination volume.

The magnet unit 10 also has a body coil 14 that is configured to emit a radio frequency signal fed via a signal line into the examination volume, to receive resonance signals emitted from the patient 100, and to pass the received resonance signals on via a signal line. In the following, the expression transmitter antenna denotes an antenna via which the radio frequency signal is emitted for exciting the nuclear spins. This may be the body coil 14, but also a local coil 50 with a transmitting function.

A control unit 20 supplies the magnet unit 10 with the different signals for the gradient coils 12 and the body coil 14 and evaluates the received signals.

Thus, the control unit 20 has a gradient controller 21 that is configured to supply the gradient coils 12 via feed lines with variable currents that provide the desired gradient fields in the examination volume in a temporally coordinated manner.

Further, the control unit 20 has a radio frequency unit 22 that is configured to generate a radio frequency pulse with a pre-determined temporal sequence, amplitude, and spectral power distribution for the excitation of a magnetic resonance of the nuclear spins in the patient 100. Thereby, pulse power levels in the region of kilowatts may be achieved. The excitation signals may be emitted via the body coil 14 or via a local transmitter antenna into the patient 100.

A controller 23 communicates via a signal bus 25 with the gradient controller 21 and the radio frequency unit 22.

Arranged on the patient 100 as a first receiving coil is a local coil 50 that is connected via a connection line 33 to the radio frequency unit 22 and a receiver of the radio frequency unit 22. The body coil 14 may be a first receiving antenna within the present embodiments.

The magnetic resonance tomography unit 1 has a transmission interference suppression device 70 according to the present embodiments. The suppression device has a sensor 71 or, as shown in an embodiment in FIG. 1, a plurality of sensors 71 that are configured to detect a radio frequency signal with the Larmor frequency of the magnetic resonance tomography unit (e.g., leakage radiation of an excitation signal of the magnetic resonance tomography unit) and to pass the radio frequency signal on as a signal to the transmission interference suppression control system 72. These may be, for example, magnetic or electrical antennae or other detectors for radio frequency electric and/or alternating magnetic fields. The sensor or sensors 71 are arranged at least in one spatial direction relative to the transmitter antenna in which a reduction of the interference radiation by excitation signals is to be achieved. In one embodiment, the sensors 71 surround the transmitter antenna at least in a plane (e.g., the horizontal plane) or fully in all spatial directions in order to reduce a propagation of interference radiation of the magnetic resonance tomography unit 1 into the surroundings.

Therein, in a possible embodiment of the magnetic resonance tomography unit 1, the sensor or sensors 71 are arranged in a far field of the transmitter antenna in which the electric field and the magnetic field of the electromagnetic radio frequency alternating field are in phase and emitted electromagnetic waves propagate in the space. Since the sensor or sensors 71 are situated in the far field, using the measurement value from the sensor 71, conclusions may readily be drawn regarding the field strengths behind the sensor as seen from the transmitter antenna.

In that the sensor is arranged at a distance that corresponds to a spacing predetermined for a limit value, the maintenance of this limit value may be provided with the transmission interference suppression device 70 according to the present embodiments.

Figure 5:
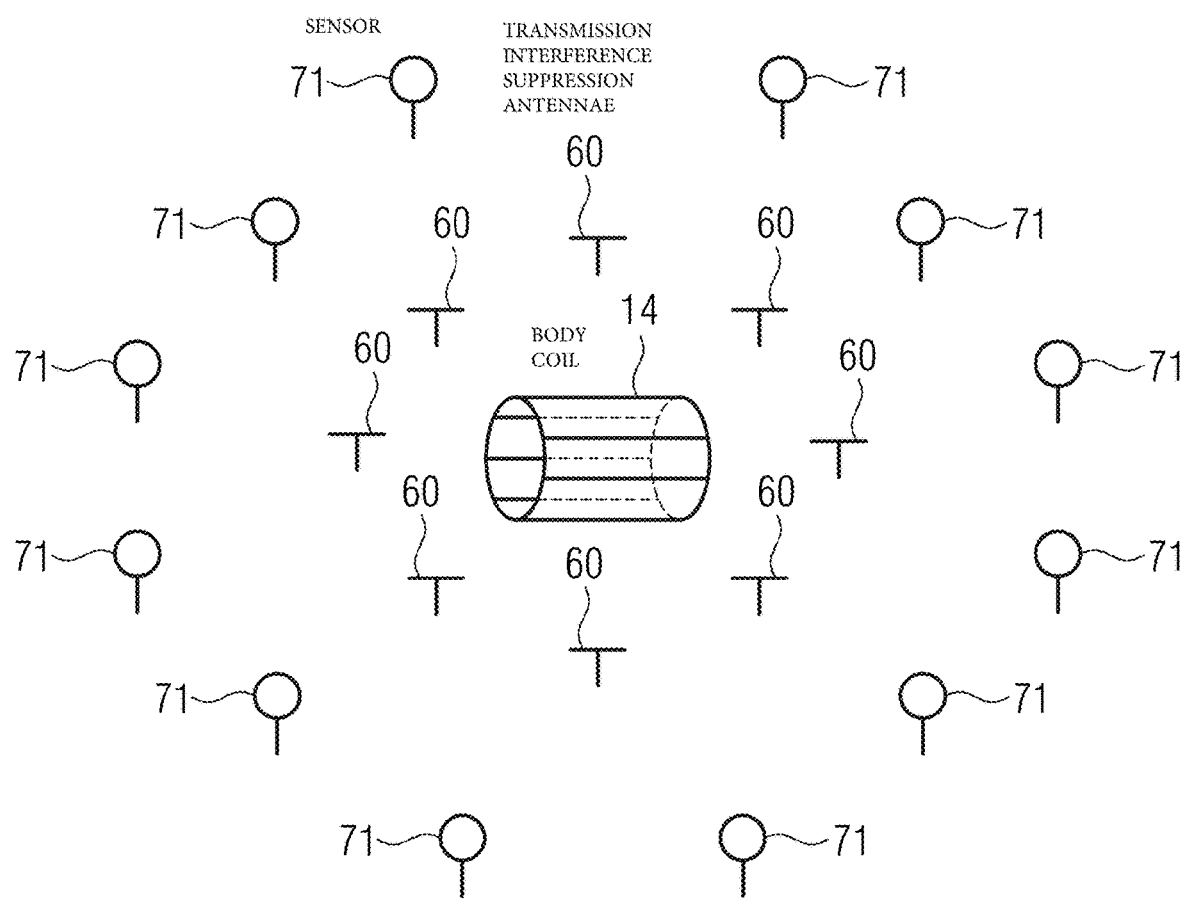
FIG. 5 shows a schematic representation of one embodiment of an arrangement including a transmitter antenna, sensors, and transmission interference suppression antennae.

FIG. 5 shows schematically the relative arrangement of the transmitter antenna, the transmission interference suppression antennae 60, and the sensors 71 relative to one another in another embodiment.

The representation is two-dimensional. A corresponding three-dimensional arrangement may, however, also be provided. The transmission interference suppression antennae 60 herein surround the transmitter antenna as a closed shell and this, in turn, is surrounded by a closed or partial shell of sensors 71. In one embodiment, however, the transmission interference suppression antennae 60 surround the transmitter antennae with the shell of sensors 71 at a great distance (e.g., in the far field).

The transmitter antenna (e.g., the body coil 14) is surrounded by the transmission interference suppression antennae 60, and these are themselves surrounded by the sensors 71. These form a closed ring or any other closed curved structure around the transmitter antenna. In the case of a transmission interference suppression in a three-dimensional direction, the sensors 71 form a closed shell or surface.

In the case of a transmission interference suppression (e.g., sectors and/or spatial directions), the sensors 71 form corresponding partial shells in these spatial directions so that the projection of the partial shells cover these spatial directions, as seen from the transmitter antenna.

Therein, the spacing between respectively adjacent sensors 71 does not exceed a maximum spacing which is smaller, for example, than a quarter, an eighth, or a tenth of the wavelength of the excitation signal. The sensors 71 therein detect field components tangentially to the envelope curve. On the basis of the electromagnetic field equations, it is thereby possible to replace the source of the fields in the interior of the shell with known virtual sources on the surface of the shell. With the sensors 71, both the fields of the transmitter antenna and also of the transmission interference suppression antennae 60 outside the shell of sensors 71 may be predicted. This method of virtual sources on the enclosing surface is known as a Huygens box. Thus, also, transfer functions for a known excitation signal to the transmitter antenna or a transmission interference suppression antenna 60 at an arbitrary point outside the shell of sensors 71 may be determined.

The transmission interference suppression antenna or antennae 60 may be arranged in proximity to the transmitter antenna in the patient tunnel 16 (e.g., on or at a plurality of transmission interference suppression antennae 60 around the opening). The transmission interference suppression antenna 60 thus lies on the propagation route of the electromagnetic wave between the transmitter antenna and the sensor 71. The same applies also to a plurality of transmission interference suppression antennae 60.

Figure 2:
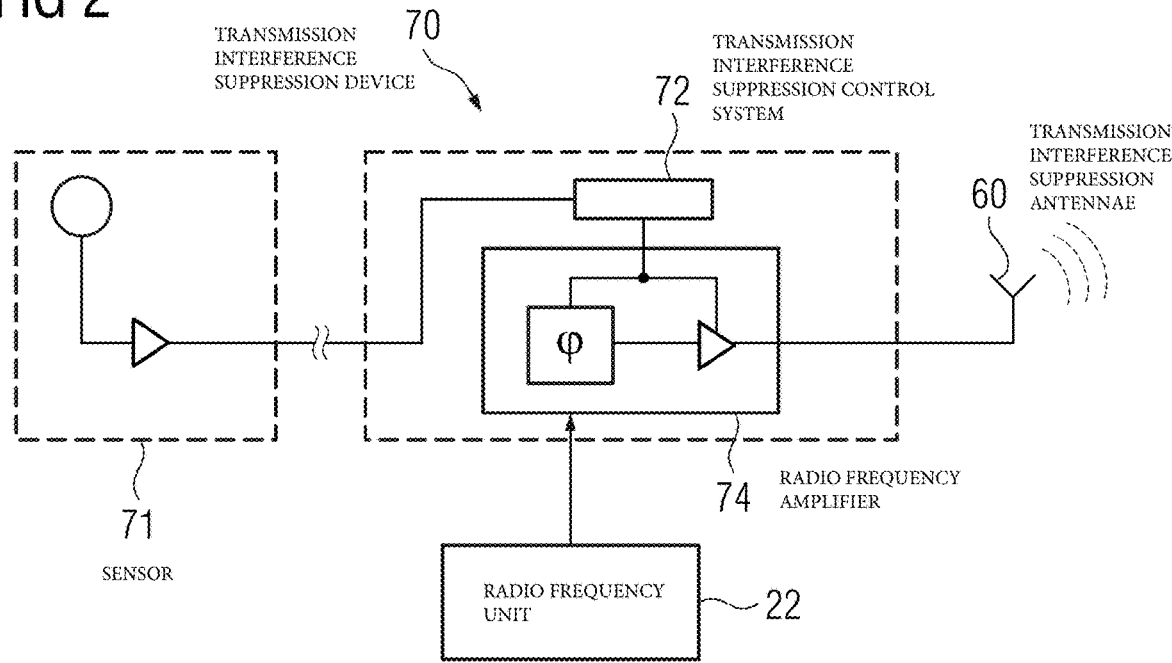
FIG. 2 schematically shows a possible embodiment of the transmission interference suppression device in detail.

FIG. 2 shows schematically a possible embodiment of the transmission interference suppression device 70 in detail.

Figure 3:
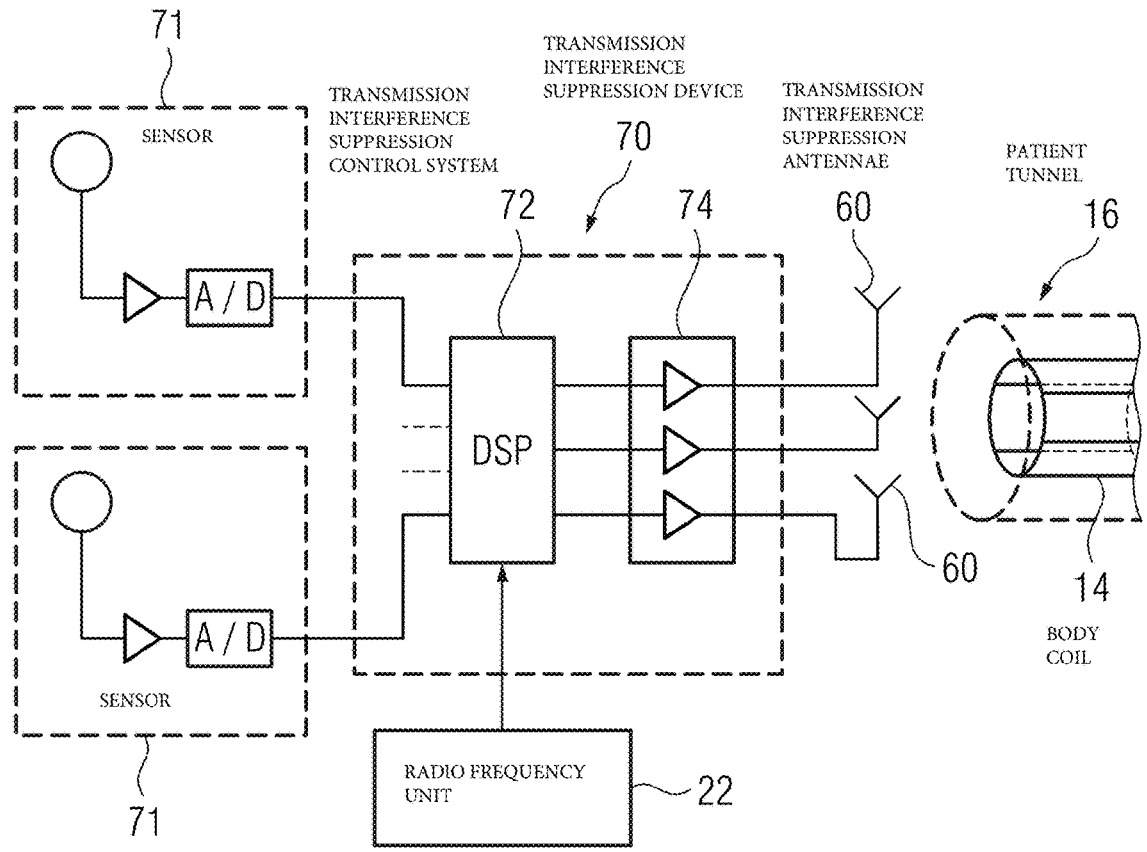
FIG. 3 schematically shows a further exemplary embodiment of the transmission interference suppression device in detail.

In FIG. 2, for the sake of greater clarity, just one sensor 60 is shown symbolically; the transmission interference suppression device 70 may, however, have a plurality of sensors 60, as indicated in FIG. 3 or FIG. 5 below.

The sensor 60 has one antenna that converts the electric and/or radio frequency alternating magnetic field of the pulse emitted by the transmitter antenna into a current and/or voltage in a conductor. In one embodiment, the sensor 60 therein detects components of the electromagnetic field tangentially to the enclosing shell, as described in relation to FIG. 5. For example, the antenna may be an induction loop or may have two loops arranged perpendicularly to one another for detecting two tangential components. The electrical signal thus generated is usually amplified by a low-noise preamplifier (LNA) in the sensor itself, before the electrical signal is passed on via a signal connection for further processing in the transmission interference suppression device 70.

FIG. 2 shows an analogue signal processing system as an exemplary embodiment.

What is fundamental is the concept that an excitation signal propagating into the surroundings as an electromagnetic wave is reduced by destructive interference, and so, the emission of the magnetic resonance tomography unit into the surroundings is kept below a limit value set by regulations.

For this purpose, different possibilities may be provided. First, the sensor 71 may serve as a measuring device for the strength of the propagating electromagnetic wave of the transmitter antenna and of the transmission interference suppression antennae 60, for example, to determine the transfer functions using test pulses. The transmission interference suppression device is then to obtain an information item regarding the excitation signal by another route, for example, as shown via a signal conductor from the radio frequency unit 22 or the control system 23. The information is suitable for generating a signal for a destructive interference. This may be, for example, the signal that is fed in the radio frequency unit 22 to a final stage for generating the excitation signal or a damped output signal of the final stage. This may, however, also be a digitized form of the excitation signal or parameter and/or signals from which the excitation signal is generated and which define these sufficiently for the generation of a difference signal.

Figure 6:
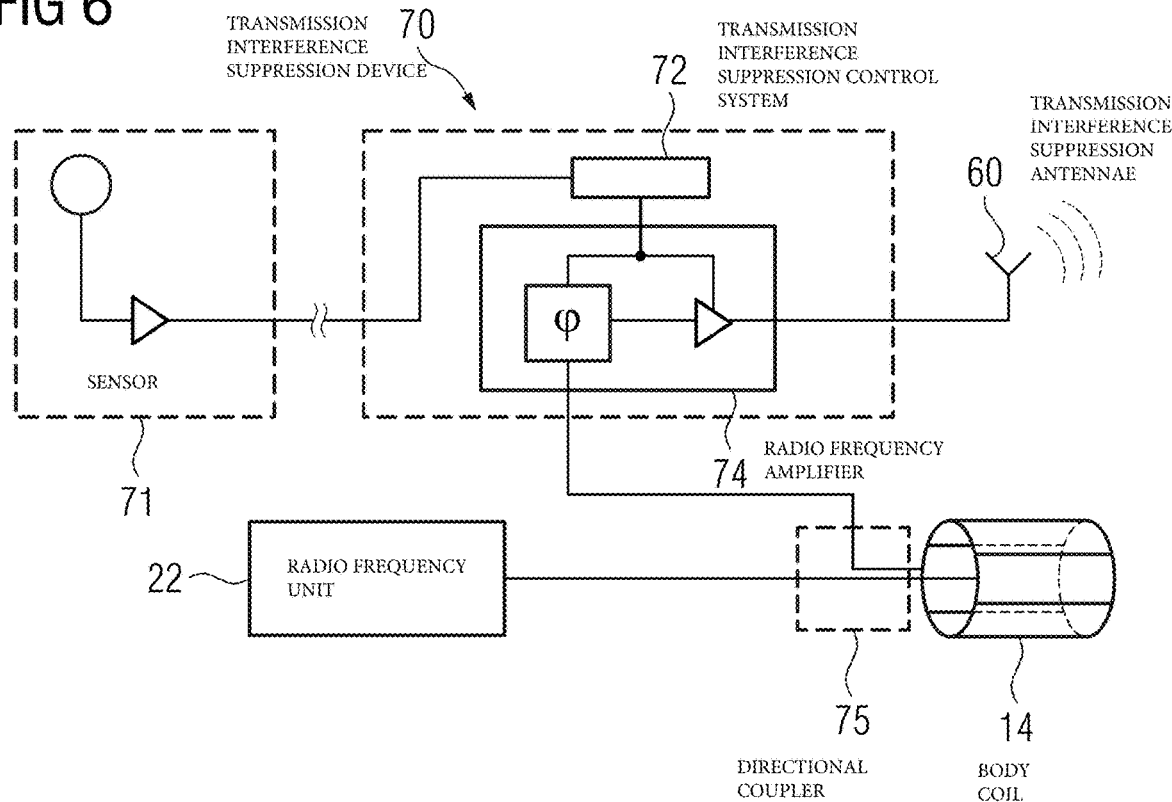
FIG. 6 schematically shows a possible embodiment of a transmission interference suppression device in detail.

In the embodiment shown in FIG. 6, the information item relating to the excitation signal is detected with a current sensor (e.g., a directional coupler at the root of the transmitter antenna, such as the body coil 14). The directional coupler 75 generates a signal that is proportional to the current that flows into the transmitter antenna and therefore also to the alternating magnetic field generated by the transmitter antenna. In one embodiment, two directional couplers may be used; each of the two directional couplers detects the inflowing current and a reflected current in order, by difference formation, to detect the current through the transmitter antenna more exactly. The signal that is proportional to the current is passed on to the transmission interference suppression device 70.

A scaled excitation signal then has a phase shift applied to the scaled excitation signal by the phase shifter 73 and is subsequently amplified by the radio frequency amplifier 74 before the amplified signal is emitted via the transmission interference suppression antenna 60. Herein, the transmission interference suppression control system 72 sets the parameters (e.g., the phase shift and amplification) dependent on the signal of the sensor 71. In one embodiment, in an optimization process, the transmission interference suppression control system 72 minimizes the energy of the sensor signal by variation of the phase and the amplification. This may, however, also take place, as previously described, using the transfer functions.

In one embodiment, the signal of the sensor itself provides the information item regarding the excitation signal, and the transmission interference suppression signal is generated therefrom by amplification and phase shift. An optimization method for reducing the energy of the sensor signal may be provided; a complete extinguishing, however, may not be provided since then the amplification of the signal would tend toward infinity, and the loop becomes unstable.

The transmission interference suppression antenna 60 may be arranged in proximity to the transmitter antenna in the patient tunnel 16 (e.g., on) or, given a plurality of transmission interference suppression antennae 60, around the opening.

In one embodiment, the transmission interference suppression antenna 60 may be arranged at a larger distance away from the transmitter antenna in the patient tunnel 16 in order to reduce a reverse effect of the transmission interference suppression antennae 71 on the excitation of the nuclear spins. It is, however, also possible to arrange the transmission interference suppression antennae 60 in the interior of the patient tunnel 16.

A further conceivable embodiment of the transmission interference suppression device is shown in FIG. 3.

The embodiment of FIG. 3 differs in that a plurality of sensors 71 and also a plurality of transmission interference suppression antennae 60 are provided. These are distributed, as far as possible, over different spatial directions in relation to the transmitter antenna (e.g., the body coil 14), so that the emission may be optimally suppressed in different spatial directions, as already stated in relation to FIG. 5. In order to supply this plurality of transmission interference suppression antennae 60 with different signals as required for adaptive suppression of the interference emission in different directions, the controllable radio frequency amplifier 74 has a plurality of independent amplifier channels for amplification of the individual signals.

In the embodiment of FIG. 3, the transmission interference suppression control system 72 has a signal processing resource (e.g., a digital signal processor (DSP) or an FPGA). In this exemplary embodiment, the sensors 71 already digitize the signals and pass the signals on to the transmission interference suppression control system 72. As already described in relation to FIG. 2, the phase shifts and damping/amplification factors may thereby be determined through an optimization method for minimizing the energy of the excitation signal received by the sensors 71 or may be determined with the aid of the transfer functions. The phase shift and amplification/damping may then be carried out by corresponding digital calculation operations.

In one embodiment, these steps take place in a similar signal processing where the mixing takes place, for example, by a crossbar-matrix with adjustable couplings and phase shifts at crossing points.

In a possible embodiment, the radio frequency amplifier 74 is arranged in direct proximity to the transmission interference suppression antennae 60 and is configured as current sources with an internal resistance tending toward zero, so that, with the same transmission interference suppression signal, the transmission interference suppression antennae 60 generate an alternating magnetic field that is largely independent of the antenna impedance, even if the impedance changes, for example, with the frequency.

Figure 4:
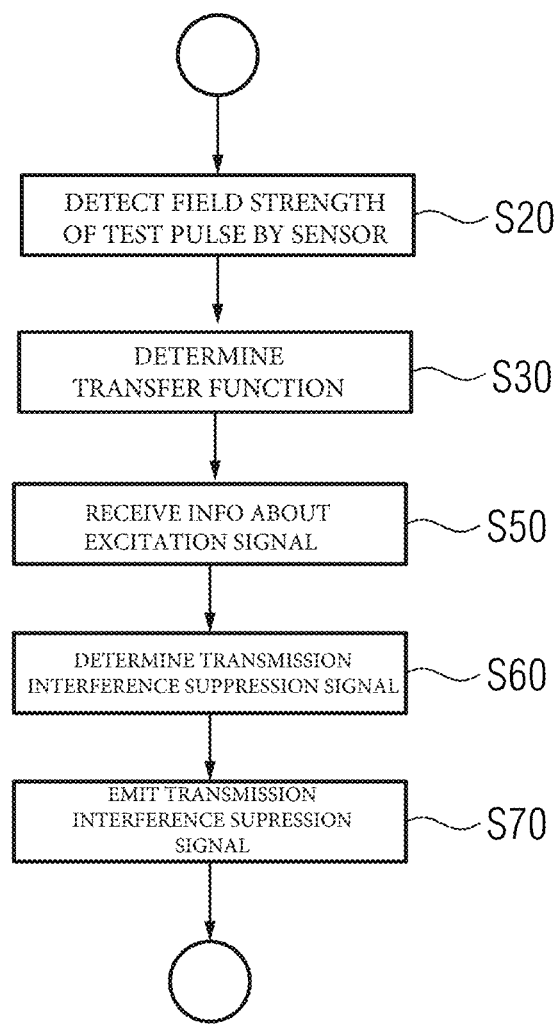
FIG. 4 shows a schematic flow diagram of an exemplary embodiment of a method.

FIG. 4 shows an exemplary flow diagram of the method according to the present embodiments for operating the transmission interference suppression device 70 in a magnetic resonance tomography unit 1 according to the present embodiments.

In act S50, the transmission interference suppression device 70 receives an information item regarding the excitation signal. In the simplest case, this may be the excitation signal itself or a signal proportional thereto, for example, damped by a factor of 20 dB, 40 dB, 60 dB or more. In the case of predetermined excitation signals for known sequences (e.g., a sinc pulse), it may, however, also be sufficient if a scaling factor, a center frequency, a phase relation, and/or a duration are given as the information item. Also conceivable are, for example, the baseband signal of the excitation signal and the mixed frequency.

In act S60, the transmission interference suppression control system determines a transmission interference suppression signal, dependent upon the information, such that when the transmission interference suppression signal is emitted via the transmission interference suppression antenna, a field strength of the excitation signal at a predetermined location is reduced.

Conceivable, for example, is a calculation on the basis of Maxwell's field equation and a known geometry. From the known excitation signal, the attenuation and the phase shift of the excitation signal are determined with the sensor. Using the information item concerning the excitation signal, a corresponding transmission interference suppression signal may then be determined with the inverse phase shift and corresponding amplification so that a negative interference is achieved with an attenuation of greater than 6 dB, 12 dB, or more. Subsequently, in act S70, the transmission interference suppression signal is emitted via the transmission interference suppression antenna 60.

As disclosed above, this enables the arrangement of the sensors 71 on a shell around the transmitter antenna and the detection of the fields by the sensors 71, to replace the field source in the interior of the shell in the manner of a Huygens box with a virtual source on the shell, and so also to detect and take account of changes, for example, by the patient.

In one embodiment, rather than the calculation, in act S10 of transmission, a test pulse may be emitted with the transmitter via the transmitter antenna. Subsequently, in act S20 of detection, a field strength evoked by the test pulse may be detected by the sensor or sensors 71. The sensor or sensors 71 may detect, for example, the electric or magnetic component.

In one embodiment, the sensors 71 detect components of the fields, as already described in relation to FIG. 5, which are arranged tangentially to the virtual shell on which the sensors 71 are arranged.

In act S30, using the known properties of the test pulse and the properties detected by the sensor or sensors 71, a transfer function between the transmitter antenna and the sensor 71 is determined by the transmission interference suppression device 70. For example, an autocorrelation algorithm may be provided. In one embodiment, at least a delay (e.g., the phase shift and the damping) is determined.

In another embodiment, in act S30, using the known properties of the test pulse and the properties detected by the sensor 71, a transfer function between the transmitter antenna and a predetermined point in the far field outside the shell of sensors 71 is determined by the transmission interference suppression device 70. As already explained, this may take place using the so-called Huygens box.

Finally, in act S60, the transmission interference suppression signal is determined dependent upon the transfer function. As previously described in relation to the calculation, this may be achieved with the transfer function determined with the test pulse using a corresponding inverse phase shift and amplification and/or more generally using the inverse transfer function.

The determination of the transfer function or transfer functions using a test pulse also permits conditions to be detected that are not accessible to the calculation since, for example, the properties of the patient are only partially known.

In one embodiment, in a similar manner, a transfer function between one or more transmission interference suppression antennae 60 and one or more sensors 71 or a predetermined location in the far field is determined. Different variations of the method may then be provided. For example, the transmission interference suppression signal may be determined directly from the transfer function and the information item regarding the excitation signal. It is therein possible that the transfer function or transfer functions are determined once at the installation of the magnetic resonance system 1. In one embodiment, however, the determination takes place at least before each image acquisition in order to take account of the change caused by the patient.

In one embodiment, in addition, the transfer functions and/or the parameters of the transfer functions such as damping and phase shift are permanently adapted by an optimization method in which, for example, the energy of the signal detected by the sensors 71, resulting from the excitation signal and the transmission interference suppression signal, is minimized. In this way, the emission of the excitation signal into the environment of the magnetic resonance tomography unit is simultaneously also minimized since the sensors may already be arranged in the far field and thereby provide a measure for the fields at a great distance.

Although the invention has been illustrated and described in detail with the exemplary embodiments, the invention is not restricted by the examples disclosed, and other variations may be derived therefrom by a person skilled in the art without departing from the protective scope of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomography unit comprising:
a magnet unit;
a transmitter;
a transmitter antenna operable to excite nuclear spins;
a transmission interference suppression device comprising:
a transmission interference suppression control system;
a sensor; and a transmission interference suppression antenna,
wherein the transmission interference suppression device is configured to:
acquire, with the sensor, an excitation signal of the transmitter for exciting nuclear spins;
determine, with the transmission interference suppression control system, a transmission interference suppression signal dependent upon the acquired excitation signal of the transmitter; and
transmit the transmission interference suppression signal via the transmission interference suppression antenna, so that at a predetermined location outside the magnetic resonance tomography unit, the excitation signal emitted by the transmitter via the transmitter antenna is attenuated,
wherein the sensor is arranged in a far field of the transmitter antenna, and the predetermined location of the attenuation is a location of the sensor, and
wherein the predetermined location is specified by a distance defined by regulation for an EMC limit value.

2. The magnetic resonance tomography unit of claim 1, wherein the transmission interference suppression control system has a signal connection to the transmitter that is configured to receive an information item regarding the excitation signal, and
wherein the transmission interference suppression control system is configured to determine the transmission interference suppression signal dependent upon the received information item.

3. The magnetic resonance tomography unit of claim 1, wherein the information item indicates an amplitude of the excitation signal.

4. The magnetic resonance tomography unit of claim 1, wherein the information item regarding the excitation signal is proportional to a magnetic field generated by the transmitter antenna.

5. The magnetic resonance tomography unit of claim 4, wherein the transmission interference suppression device has a directional coupler, and
wherein the directional coupler is arranged at a signal connection between the transmitter and the transmitter antenna and is configured to detect a current flow through the transmitter antenna.

6. The magnetic resonance tomography unit of claim 4, wherein the transmission interference suppression device has a radio frequency amplifier that is arranged in direct proximity to the transmission interference suppression antenna.

7. The magnetic resonance tomography unit of claim 1, wherein the transmission interference suppression device comprises a plurality of sensors and a plurality of transmission interference suppression antennae, the plurality of sensors comprising the sensor, and the plurality of transmission interference suppression antennae comprising the transmission interference suppression antenna, each of the plurality of sensors and the plurality of transmission interference suppression antennae being at different locations,
wherein the transmission interference suppression device is configured to:
determine the transmission interference suppression signal dependent upon the excitation signal of the transmitter acquired via the plurality of sensors; and
emit the transmission interference suppression signal via the plurality of transmission interference suppression antennae, so that at the locations of the plurality of sensors, the excitation signal emitted by the transmitter via the transmitter antenna is attenuated.

8. The magnetic resonance tomography unit of claim 7, wherein the transmission interference suppression signal has a plurality of components, and
wherein the transmission interference suppression device is configured to in each case transmit a component of the plurality of components via a respective one transmission interference suppression antenna of the plurality of transmission interference suppression antennae.

9. A method for operating a magnetic resonance tomography unit, wherein the magnetic resonance tomography unit comprises a magnet unit, a transmitter, a transmitter antenna for exciting nuclear spins, and a transmission interference suppression device with a transmission interference suppression control system and a transmission interference suppression antenna, the method comprising:
receiving an information item regarding an excitation signal, wherein the information item indicates an amplitude of the excitation signal;
determining, by the transmission interference suppression control system, a transmission interference suppression signal dependent upon the information, such that when the transmission interference suppression signal is emitted via the transmission interference suppression antenna, a field strength of the excitation signal at a predetermined location is reduced; and
transmitting the transmission interference suppression signal via the transmission interference suppression antenna.

10. The method of claim 9, wherein the transmission interference suppression device comprises a sensor,
wherein the method further comprises:
emitting a test pulse with the transmitter via the transmitter antenna;
detecting a field strength evoked by the test pulse with the sensor; and
determining, by the transmission interference suppression device, a transfer function between the transmitter antenna and the sensor, and
wherein determining the transmission interference suppression signal is dependent on the transfer function.

11. The method of claim 10, wherein the predetermined location is in a far field of the transmitter antenna, and the transfer function is a far field transfer function.

12. The method as claimed in claim 10, wherein the transmission interference suppression device comprises a plurality of sensors and a plurality of transmission interference suppression antennae, the plurality of sensors comprising the sensor, and the plurality of transmission interference suppression antennae comprises the transmission interference suppression antenna,
wherein detecting the field strength evoked by the test pulse comprises detecting, by the plurality of sensors, a field strength of the test pulse, and
wherein determining the transmission interference suppression signal comprises:
determining a plurality of transfer functions for the plurality of sensors; and
determining the transmission interference suppression signal dependent on the plurality of transfer functions.

13. The method of claim 9, further comprising detecting a field strength of the excitation signal with the sensor,
wherein determining the transmission interference suppression signal comprises minimizing, by an optimization algorithm, energy of the excitation signal received with the sensor, dependent upon the field strength detected.

14. The method of claim 9, wherein the information item regarding the excitation signal is proportional to a magnetic field generated by the transmitter antenna.

15. The method of claim 14, wherein the transmission interference suppression device has a directional coupler, and
wherein the directional coupler is arranged at a signal connection between the transmitter and the transmitter antenna and is configured to detect a current flow through the transmitter antenna.

16. A magnetic resonance tomography unit comprising:
a magnet unit;
a transmitter;
a transmitter antenna operable to excite nuclear spins;
a transmission interference suppression device comprising:
a transmission interference suppression control system;
a sensor; and
a transmission interference suppression antenna,
wherein the transmission interference suppression device is configured to:
acquire, with the sensor, an excitation signal of the transmitter for exciting nuclear spins;
determine, with the transmission interference suppression control system, a transmission interference suppression signal dependent upon the acquired excitation signal of the transmitter; and
transmit the transmission interference suppression signal via the transmission interference suppression antenna, so that at a predetermined location outside the magnetic resonance tomography unit, the excitation signal emitted by the transmitter via the transmitter antenna is attenuated,
wherein the sensor is arranged in a far field of the transmitter antenna, and the predetermined location of the attenuation is a location of the sensor,
wherein the transmission interference suppression control system has a signal connection to the transmitter that is configured to receive an information item regarding the excitation signal, and
wherein the transmission interference suppression control system is configured to determine the transmission interference suppression signal dependent upon the received information item.

* * * * *